United States Patent [19]

Lovering

[11] 4,095,891
[45] Jun. 20, 1978

[54] ON-THE-FLY PHOTORESIST EXPOSURE APPARATUS

[75] Inventor: Howard Byron Lovering, Bedford, Mass.

[73] Assignee: GCA Corporation, Bedford, Mass.

[21] Appl. No.: 754,332

[22] Filed: Dec. 27, 1976

[51] Int. Cl.² .................... G03B 27/48; G03B 27/50
[52] U.S. Cl. ........................................ 355/50; 354/4; 355/54; 355/63; 355/71
[58] Field of Search ................ 355/50, 51, 43, 53, 355/54, 60, 63, 66, 67, 71; 354/4; 331/94.5 K

[56] References Cited

U.S. PATENT DOCUMENTS

| 3,903,536 | 9/1975 | Westerberg | 354/4 |
| 4,023,126 | 5/1977 | Schlafer | 355/51 |

Primary Examiner—Richard A. Wintercorn
Attorney, Agent, or Firm—Kenway & Jenney

[57] ABSTRACT

A system for exposing photoresists "on-the-fly" is disclosed. The system incorporates a dye laser having an output pulse duration of less than about 250 nanoseconds to expose the photoresist while the photoresist is moving. Means are provided to synchronize the output of the laser to the motion of a photoresist coated surface and to insure spatial uniformity of energy across an object plane of an optical projection system.

2 Claims, 4 Drawing Figures

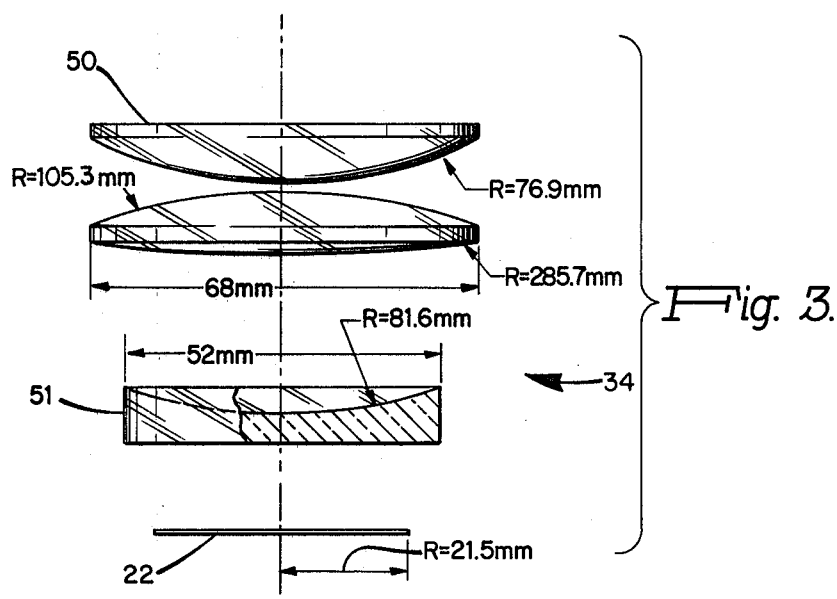
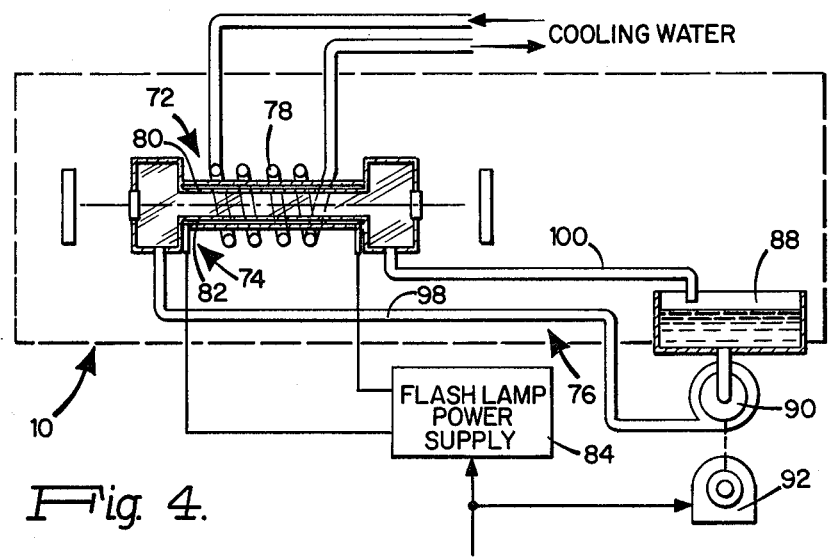
Fig. 3.
Fig. 4.

ON-THE-FLY PHOTORESIST EXPOSURE APPARATUS

This invention relates to apparatus for exposing photoresists used, for example, in manufacturing masks for the semiconductor industry, and more particularly, to the use of a laser to expose a photoresist "on-the-fly".

BACKGROUND OF THE INVENTION

Photoresists are polymers which change their physical character when exposed to the electromagnetic energy at a frequency to which they are sensitive. For example, a photoresist soluble in a particular fluid may, after exposure to a selected source of electromagnetic energy and subsequent development, be insoluble in the same fluid, i.e. the developer. The opposite or schism reaction is equally common.

Photoresists have been used by the semiconductor industry for many years to make optical masks used in the manufacture of semiconductor devices and in particular integrated circuits. The precision and quality of the mask determines the quality of and the density with which circuit components can be packed onto a semiconductor wafer. Briefly, the mask is made by coating a substrate with a photoresist, exposing the photoresist to a selected pattern of energy, developing the photoresist, and etching an underlying substrate to obtain the mask. In a negative acting photoresist, that portion of the photoresist which had been exposed to electromagnetic energy is insoluble in the developer and protects the surface on which it is coated during a subsequent etching step. When a positive acting photoresist is used, it is the portion of the photoresist which is exposed to electromagnetic energy which is soluble in the developer. The resulting mask is most often used in contact with a semiconductor wafer. Alternatively, the same effect may be obtained by using a photoresist coating directly on the semiconductor.

To date, silver halide emulsions have generally been used by the semiconductor industry to make masks because they are relatively sensitive to available energy sources and can be exposed "on-the-fly", that is, without mechanically stopping the emulsion during the exposure time, which may be as short as one to five microseconds. This is very important because a typical mask may require a plurality of exposures to form a pattern; and the number of exposures may be as great as 200,000.

Emulsions, however, have several inherent disadvantages, the primary one being an undesirably low resolution. Therefore, searches are constantly being conducted for systems which could provide higher resolution than that available with emulsions.

Photoresists have generally been regarded by the semiconductor industry as superior to emulsions. Photoresists are generally regarded as having significantly greater resolution than emulsions and have less tendency to produce defects in the final product. Unfortunately, however, photoresists require almost three orders of magnitude more energy than do silver halide emulsions. For this reason, it has hitherto been required that equipment using photoresists stop during exposure.

It is therefore an object of this invention to provide an "on-the-fly" exposure system which can properly expose a photoresist during continuous movement of the resist and at the same time maintain high resolution. Other objects of this invention include providing an "on-the-fly" exposure system for photoresists which is reliable, simple to operate, efficient, and in which exposure times of less than about 250 nanoseconds are obtained. Further objects of the invention include providing an "on-the-fly" exposure system for photoresists having uniform spatial energy distribution in an object plane of the system.

SUMMARY OF THE INVENTION

The invention relates to an "on-the-fly" exposure system for exposing surfaces coated with photoresist materials. The system features an optical projection system, a support surface movable in the image plane of the optical system, and means operable with a laser source to provide pulses of electromagnetic energy from the laser at predetermined times. Each pulse has a time duration of less than about 250 nanoseconds in a preferred embodiment. The optical projection system has a first optical system for projecting the electromagnetic energy from the laser source onto an object plane, and a second optical system for imaging the object plane onto an image plane. The photoresist is thereby satisfactorily exposed while it is in continuous motion relative to the laser.

In a preferred embodiment, the invention features a dye laser as the source of electromagnetic energy. This laser is capable of generating sufficient electromagnetic energy in an energy band to which the photoresist is sensitive, and in the required time, to properly expose the relatively insensitive photoresist material.

SUMMARY OF THE DRAWINGS

Other features, objects and advantages of the invention will appear from the following description of a preferred embodiment and the attached drawings in which:

FIG. 3 is a detailed drawing of the condensing lens used in the preferred embodiment of the invention; and FIG. 4 is a schematic drawing showing the laser source of the preferred embodiment of the invention in greater detail.

DESCRIPTION OF A PREFERRED EMBODIMENT

Figure 1:
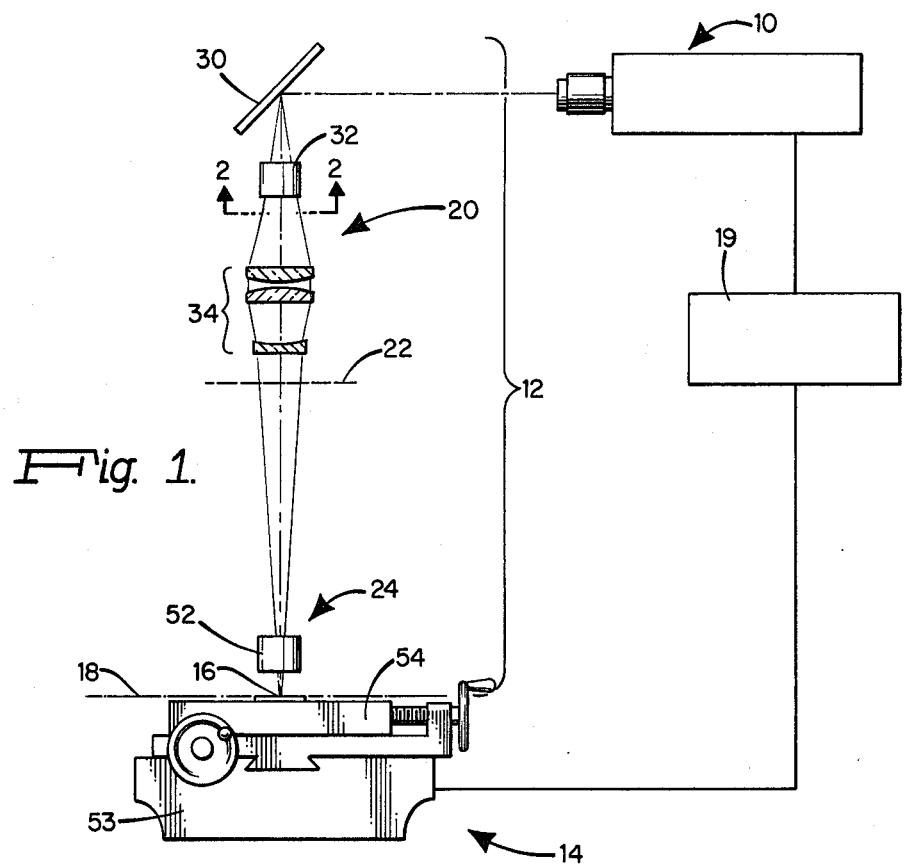
FIG. 1 is a schematic representation of the elements of a preferred embodiment of the invention.

Referring to FIG. 1, the preferred embodiment of the invention comprises a laser source 10 of electromagnetic energy, an optical projection system 12, means 14 to support and move a photoresist coated surface 16 in an image plane 18 of the optical projection system, and means 19 to synchronize operation of the laser and movement of the photoresist coated surface. Means 19 may have a preset instruction list or may receive instructions continuously, for example from a computer (not shown).

The optical projection system 12 includes a first optical system 20 to project in a uniform field, energy emitted by the laser 10 onto a pattern formed in an object plane 22 of the optical projection system. The optical projection system 12 also includes a second optical system 24 for focusing the object plane image onto the image plane 18.

The first optical system, in the preferred embodiment, includes a flat mirror 30, an integrator 32, and a condensing lens 34. Mirror 30 is provided solely for convenience and may be omitted. Mirror 30 is oriented at 45° to the axis of the laser source and changes the direction of the energy emitted by the laser from the horizontal plane to a vertical plane to direct it downward onto an integrator element 32. The output of the integrator element passes through condensing lens system 34 and onto the object plane 22.

Figure 2:
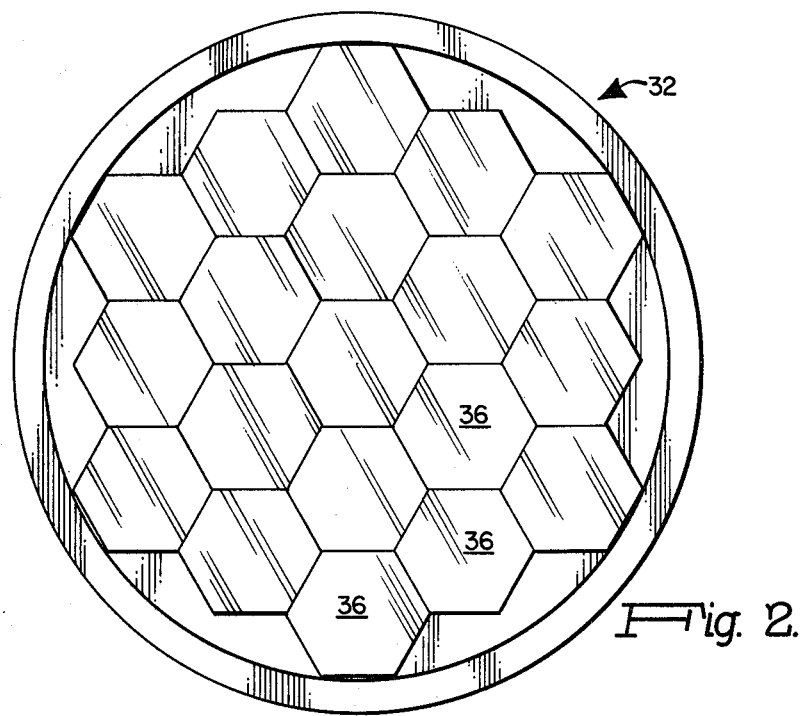
FIG. 2 is an end view of the integrator used in the optical projection system of the preferred embodiment of the invention.

The output of a laser is typically not uniform across its field. Integrator 32 acts to provide a more uniform spatial energy distribution and, in combination with condensing lens 34, substantially eliminates non-uniformities at the object plane. Referring to FIG. 2, integrator 32, in the preferred embodiment, includes nineteen identical elements 36 arranged in a hexagonal configuration. In the preferred embodiment, each element is approximately 4 millimeters long and has a hexagonal cross-section which can be circumscribed by a circle having a diameter of about 1.386 mm. The ends of each element 36 are rounded and have a spherical radius of approximately 1.31 millimeters. The integrator elements are fabricated from Schott tempax.

Referring to FIG. 3, the condensing lens 34, used in the preferred embodiment in combination with integrator 32, is designed to correct for spherical aberration of the integrator and to provide a uniform field across a predetermined pattern area of the object plane 22. The condensing lens is preferably made from special crown glass and is dimensioned as shown in FIG. 3. The distance from an input surface 50 of condensing lens 34 to the integrator is, in the preferred embodiment, 166.2 millimeters and the distance from an output surface 51 to the object plane 22 is, in the preferred embodiment, 15 millimeters.

The second optical system 24 includes a projection lens 52 which is designed to image the uniform pattern of electromagnetic energy appearing in object plane 22 onto the image plane 18. The projection lens 52 is, in the preferred embodiment, a commercial lens, for example type Ultra Micro Nikkor $g$-$h$ achromat, designed to operate at a 10:1 reduction ratio. The distance from the object plane to the lens pupil of the projection lens is, in the preferred embodiment, 248 millimeters.

The first and second optical systems are interdependent because projection lens 52 is positioned so that the output end of integrator 32 is imaged by condensing lens 34 onto the pupil of the projection lens. Photoresist coated surface 16 is supported in the image plane by the move and support means 14, which is, in the preferred embodiment, an X-Y motion generator. The base 53 of the X-Y motion generator may be similar to or identical with the base of the model 3000 Pattern Generator or model 3095 High Speed Photorepeater manufactured by the David Mann division of GCA, located in Burlington, Massachusetts. Either of these drive units provides precision controlled continuous movement of a support carriage 54 which holds and supports the photoresist coated surface. The entire support carriage moves in a plane parallel to the image plane and carries the coated surface so that the photoresist is at all times squarely in the image plane.

When used to produce a mask, the surface on which the photoresist is coated is, in the preferred embodiment, a top surface of an 800 Angstrom thick chromium coating supported on a glass substrate. The substrate is securely mounted on the support carriage 54 with the photoresist in the image plane. Carriage 54 is moved along a controlled path under control of the synchronization means 19. Other suitable support surfaces could be used, for example, an iron oxide coated glass substrate. Alternatively, the photoresist may be coated directly on a semiconductor substrate in which case a mask is not required.

A photoresist which is particularly useful with the laser to be described below is Type AZ1350B positive working photoresist manufactured by Azoplate Corporation, Murray Hill, New Jersey and distributed in the United States by Shipley Co., Inc., Newton, Massachusetts. The photoresist is applied by any standard coating technique, such as spin, spray, or roller coating, and, in the preferred embodiment the coating is 0.35 microns thick.

The laser source 10 is operated in a pulsed mode to provide extremely short bursts of high energy at a frequency to which the photoresist is sensitive. Most lasers are not suitable for use in an on-the-fly exposure system employing photoresists because they are incapable of providing sufficient energy at the desired wavelength to properly expose the photopolymer in the time necessary to sustain high speed and high resolution. The pulse must be typically less than approximately one or two microseconds for an image plane speed of 1 inch/sec. However, a dye laser, for example model D-1200 manufactured by the Phase-R Corporation, New Durham, New Hampshire, has been found to be suitable for properly exposing a photopolymer. This laser provides, in response to control signals from synchronization means 19, pulses having a time duration of less than about 250 nanoseconds and a laser output per pulse equal to about 50 millijoules. The output wavelength of this laser is determined by the dye which is used. When the dye laser is used to expose Shipley AZ135B photoresist, a suitable dye is Exciton 440 (Exciton Chemical Co., Inc., Dayton, Ohio) and the output wavelength is 440 nanometers ±20 Angstroms.

Referring to FIG. 4, the dye laser includes a cooling system 72, an excitation system 74, and a dye circulation system 76. One preferred cooling system 72 comprises coils 78 which surround the body 80 of the dye laser and which cool not only the laser body but the excitation system 74 as well. Cooling water is continuously circulated through coils 78 during operation of the laser.

Preferably, the excitation for the laser system is derived from a coaxial Xenon flash lamp 82 which surrounds the neck of the laser. The Xenon flash lamp is powered from power supply 84, which in the preferred embodiment provides an input energy to the lamp of about 38.7 joules whenever commanded to do so by the synchronization means. Dye is pumped through the laser from a reservoir 88 by a pump 90 driven by a motor 92. As noted above, in this particular embodiment, the dye is preferably Exciton Coumarin 440. It is prepared at $3.2 \times 10^{-4}$ molar in a solvent of 70% water and 30% MeOH (7 methylamino-4, 6 dimethylcoumarin). The dye is pumped from a reservoir 88 through tubing 98 to the laser body. The spent dye is returned to the reservoir through tubing 100. The pump and reservoir combination must have sufficient capacity to provide a complete change of the dye solution in the laser between the laser firing times in order to maintain the required high output energy.

In a typical system, the carriage is in continuous motion at a speed of 25 mm/sec under the control of the synchronization means and the Xenon flash lamp is fired at a periodic rate of about 6 flashes per second. Keeping in mind that the pulse width available from the laser is about 250 nanoseconds or less, this provides an undetectable degradation of resolution at the photopolymer surface.

Other embodiments of the invention will occur to those skilled in the art and are within the following claims.

What is claimed is:

1. An on-the-fly exposure system for exposing surfaces coated with photoresist materials comprising a dye laser source of electromagnetic energy capable of lasing at a wavelength to which the photoresist is highly sensitive, a synchronization means operable in combination with said laser source to provide pulses of electromagnetic energy from the laser source at predetermined times while the photoresist is in continuous motion relative to the laser, said pulses having a duration of less than about 250 nanoseconds, an optical projection system having an object plane, an image plane, a first optical system for projecting a substantially uniform spatial distribution of electromagnetic energy from said laser onto said object plane, said first optical system including an integrator means, and a second optical system for imaging said object plane onto said image plane, a movable support surface for supporting said photoresist coated surface in the image plane and for continuously moving the photoresist coated surface in the image plane in response to a set of commands from the synchronization means, and means to provide a pattern in the object plane limiting the spatial distribution of energy reaching the image plane.

2. An on-the-fly exposure system for exposing surfaces coated with photoresist materials comprising a dye laser source of electromagnetic energy capable of lasing at a wavelength to which the photoresist is highly sensitive, an optical projection system having an object plane, an image plane, a first optical system for projecting said electromagnetic energy onto said object plane, said optical system including an integrator for providing increased uniformity of said radiation across the object plane, and a second optical system for imaging said object plane onto said image plane, a movable support comprising a carriage for supporting said photoresist coating in said image plane and means for continuously moving said photoresist coating in said image plane, means to provide a pattern in the object plane, and means operable with the laser source and said movable support to provide pulses of electromagnetic energy from said laser source at predetermined times while the photoresist coated surface is in continuous motion in said image plane relative to the laser, said pulses having a time duration of less than about 1 microsecond.

* * * * *